US012271665B2

United States Patent
Meng et al.

(10) Patent No.: US 12,271,665 B2
(45) Date of Patent: Apr. 8, 2025

(54) INTELLIGENT OPERATIONAL OPTIMIZATION METHOD IN MUNICIPAL SOLID WASTE INCINERATION PROCESS

(71) Applicant: BEIJING UNIVERSITY OF TECHNOLOGY, Beijing (CN)

(72) Inventors: Xi Meng, Beijing (CN); Qizheng Hou, Beijing (CN); Junfei Qiao, Beijing (CN)

(73) Assignee: BEIJING UNIVERSITY OF TECHNOLOGY, Beijing (CN)

( * ) Notice: Subject to any disclaimer, the term of this patent is extended or adjusted under 35 U.S.C. 154(b) by 0 days.

(21) Appl. No.: 18/796,867

(22) Filed: Aug. 7, 2024

(65) Prior Publication Data

US 2025/0045489 A1 Feb. 6, 2025

Related U.S. Application Data

(63) Continuation of application No. PCT/CN2024/072775, filed on Jan. 17, 2024.

(30) Foreign Application Priority Data

Jul. 31, 2023 (CN) .......................... 202310951828.4

(51) Int. Cl.
*G06F 30/25* (2020.01)
*F23G 5/50* (2006.01)

(52) U.S. Cl.
CPC .............. *G06F 30/25* (2020.01); *F23G 5/50* (2013.01)

(58) Field of Classification Search
CPC ................................ G06F 30/25; F23G 5/50
(Continued)

(56) References Cited

U.S. PATENT DOCUMENTS 10,570,024 B2 * 2/2020 Han ....................... G06N 3/088
10,919,791 B2 * 2/2021 Han ....................... G06F 30/27
(Continued)

FOREIGN PATENT DOCUMENTS

CN 108009639 A 5/2018
CN 108644805 A 10/2018
(Continued)

OTHER PUBLICATIONS

Chen et al. ((Assessing wastewater reclamation potential by neural network model, Engineering Applications of Artificial Intelligence 16 (2003) 149-157) ) (Year: 2003).*
(Continued)

*Primary Examiner* — Iftekhar A Khan
(74) *Attorney, Agent, or Firm* — M&B IP Analysts, LLC (57) ABSTRACT

Provided is an intelligent operational optimization method in the municipal solid waste incineration process, which belongs to both the field of municipal solid waste treatment and the field of intelligent optimization. The method includes: constructing a sample data set by collecting historical data in the municipal solid waste incineration process; with optimization objectives of nitrogen oxide emissions and combustion efficiency, establishing an SORBF neural network-based indicator model to characterize the mapping relationship between operational variables and optimization objectives in the municipal solid waste incineration process; and setting the established indicator model as evaluation functions of a multi-objective optimization algorithm, and obtaining optimal setting values of the operational variables by the multi-objective particle swarm optimization algorithm, so as to improve combustion efficiency while reducing concentrations of nitrogen oxide emissions.

6 Claims, 4 Drawing Sheets

(58) Field of Classification Search
USPC .......................................................... 703/7
See application file for complete search history.

(56) References Cited

U.S. PATENT DOCUMENTS

| | | | | |
|---|---|---|---|---|
| 12,105,075 B2* | 10/2024 | Han | ...................... | G06N 3/08 |
| 2009/0241420 A1* | 10/2009 | Rokhvarger | ............... | C10J 3/80 |
| | | | | 48/62 R |
| 2014/0052422 A1* | 2/2014 | Wan | ...................... | C02F 3/006 |
| | | | | 703/2 |
| 2016/0123949 A1* | 5/2016 | Han | ...................... | G06N 3/088 |
| | | | | 702/25 |
| 2017/0184507 A1* | 6/2017 | Heywood | ............ | G01N 31/227 |
| 2017/0185892 A1* | 6/2017 | Han | ...................... | C02F 3/006 |
| 2018/0029900 A1* | 2/2018 | Han | ...................... | C02F 1/008 |
| 2018/0164272 A1* | 6/2018 | Han | ...................... | G06N 3/088 |
| 2018/0276531 A1* | 9/2018 | Han | ...................... | G06N 3/044 |
| 2019/0330550 A1* | 10/2019 | Wang | ...................... | C10L 5/04 |
| 2019/0359510 A1* | 11/2019 | Han | ...................... | C02F 1/586 |
| 2020/0024168 A1* | 1/2020 | Han | ...................... | G06F 30/27 |
| 2020/0301408 A1* | 9/2020 | Elbsat | ...................... | G06N 3/04 |
| 2020/0385286 A1* | 12/2020 | Han | ...................... | G06Q 50/06 |
| 2022/0082545 A1 | 3/2022 | Han et al. | | |
| 2022/0194830 A1* | 6/2022 | Han | ...................... | C02F 3/02 |
| 2022/0383062 A1* | 12/2022 | Han | ...................... | G06N 3/006 |
| 2023/0186254 A1* | 6/2023 | Chen | ...................... | G06Q 10/30 |
| | | | | 705/308 |
| 2023/0259075 A1* | 8/2023 | Han | ...................... | G05B 13/0265 |
| | | | | 700/29 |
| 2024/0078410 A1* | 3/2024 | Qiao | ...................... | F23G 5/50 |

FOREIGN PATENT DOCUMENTS

| | | |
|---|---|---|
| CN | 114611398 A | 6/2022 |
| CN | 117035005 A | 11/2023 |

OTHER PUBLICATIONS

Ihsanullah et al. (Recent advances in applications of artificial intelligence in solid waste management: A review, Elsevier, 2022, pp. 1-54) (Year: 2022).*

Meng at al. (Nonlinear System Modeling Using RBF Networks for Industrial Application, IEEE, 2017, pp. 931-940) (Year: 2017).*

International Search Report for PCT/CN2024/072775, dated Mar. 27, 2024. Searching Authority China National Intellectual Property Administration, Beijing, China 100088.

Written Opinion of the Searching Authority for PCT/CN2024/072775, dated Mar. 27, 2024. Searching Authority China National Intellectual Property Administration, Beijing, China 100088.

* cited by examiner

INTELLIGENT OPERATIONAL OPTIMIZATION METHOD IN MUNICIPAL SOLID WASTE INCINERATION PROCESS

CROSS-REFERENCE TO RELATED APPLICATION

This patent application is a continuation of International Application No. PCT/CN2024/072775, filed on Jan. 17, 2024, which claims the benefit and priority of Chinese Patent Application 202310951828.4 filed with the China National Intellectual Property Administration on Jul. 31, 2023 and entitled "INTELLIGENT OPERATIONAL OPTIMIZATION METHOD IN MUNICIPAL SOLID WASTE INCINERATION PROCESS". Both of the aforementioned applications are hereby incorporated by reference in their entireties.

TECHNICAL FIELD

The present disclosure relates to the field of municipal solid waste treatment and intelligent optimization, and in particular, to an intelligent operational optimization method in a municipal solid waste incineration process.

BACKGROUND

Massive accumulation of solid waste is harmful to human health while seriously polluting environment, such as soil, air, and water. A main treatment manner for municipal solid waste that cannot be directly recycled is an incineration technology. However, with rapid development of municipal solid waste incineration industry, more and more pollutants are discharged, such as nitrogen oxide. The $NO_x$ generated during incineration is difficult to effectively remove, which poses a threat to both ecological environment and human health.

At present, manual experience is often relied on for air distribution, materials distribution and addition of reductants, such as urea, to avoid excessive $NO_x$ emissions during an operation of a municipal solid waste incineration plant, which has disadvantages of leading to instable combustion in an incinerator and generating secondary pollution. Therefore, designing an intelligent operational optimization method in a municipal solid waste incineration process to accurately and effectively set and adjust operational variables is an important means to reduce $NO_x$ emissions and improve combustion efficiency during municipal solid waste incineration process and is also a technology and a research emphasis that urgently need to be implemented.

SUMMARY

An objective of the present disclosure is to provide an intelligent operational optimization method in municipal solid waste incineration process. With optimization objectives of improving combustion efficiency and reducing $NO_x$ emissions, optimal setting values of operational variables (including a grate speed, a primary air inlet flow, a primary air outlet pressure, and a secondary air inlet flow) during an operation of municipal solid waste incineration are sought in the case of satisfying an actual constraint condition, so as to provide guidance for an actual industrial process.

To achieve the above objective, a technical solution of the present disclosure is as follows:

An intelligent operational optimization method in municipal solid waste incineration process includes:

step 1: constructing a sample data set by collecting historical data in municipal solid waste incineration process, and dividing the sample data set into a training set and a testing set;

step 2: establishing a nitrogen oxide indicator model, a carbon monoxide indicator model, and a carbon dioxide indicator model based on a self-organizing radial basis function (SORBF) neural network according to the training set to characterize a mapping relationship between operational variables and optimization objectives in the solid waste incineration process, where the operational variables include a grate speed, a primary air inlet flow, a primary air outlet pressure, and a secondary air inlet flow, the optimization objectives include reducing nitrogen oxide emissions and improving combustion efficiency, and the combustion efficiency is calculated by output values of the carbon monoxide indicator model and the carbon dioxide indicator model;

step 3: setting the nitrogen oxide indicator model, the carbon monoxide indicator model, and the carbon dioxide indicator model as evaluation functions of a multi-objective particle swarm optimization algorithm, to evaluate quality of solutions in population;

step 4: obtaining Pareto optimal solution set of the operational variables by the multi-objective particle swarm optimization algorithm; and step 5: determining optimal setting values of the operational variables from the Pareto optimal solution set based on a utility function.

In an embodiment, the step 1 includes: collecting and storing the historical data in the municipal solid waste incineration process through a detection device, the historical data including the grate speed, the primary air inlet flow, the primary air outlet pressure, the secondary air inlet flow, an $NO_x$ concentration, a CO concentration, and a $CO_2$ concentration; and constructing the sample data set based on the collected historical data.

In an embodiment, the establishing a nitrogen oxide indicator model, a carbon monoxide indicator model and a carbon dioxide indicator model in the step 2 includes:

step 21: training the SORBF neural network according to the training set, where the SORBF neural network contains 0 hidden layer neuron at an initial moment;

step 22: adding a first hidden layer neuron to the SORBF neural network based on a training sample corresponding to an expected output value with maximum absolute value in the training set;

step 23: adjusting a parameter of the SORBF neural network added with the first hidden layer neuron based on a second-order learning algorithm;

step 24: calculating an error vector of the training set based on the data in the training set and an output of the SORBF neural network, where the error vector includes an error value of each training sample; determining an error peak point, which is an error value with a maximum absolute value; adding a next hidden layer neuron to the SORBF neural network based on the training sample corresponding to the error peak point;

step 25: adjusting a parameter of the SORBF neural network added with the next hidden layer neuron based on the second-order learning algorithm; and step 26: repeating the step of adding the next hidden layer neuron to the SORBF neural network based on the training sample corresponding to the error peak point and the step of adjusting the parameter of the SORBF neural network added with the next hidden layer neuron, until learning accuracy of the SORBF neural network reaches predetermined accuracy or until the number of hidden layer neurons in the SORBF neural network reaches a predetermined number, thereby completing construction of the nitrogen oxide indicator model, the carbon monoxide indicator model, or the carbon dioxide indicator model.

When the nitrogen oxide indicator model, the carbon monoxide indicator model, and the carbon dioxide indicator model are constructed, inputs of the SORBF neural network are different, and outputs of the SORBF neural network are also different, and the inputs are determined from the training set.

In an embodiment, the step 4 includes:

step 41: initializing an initial position and an initial speed of each particle in a particle swarm; where the initial speed of each particle is 0, the initial position of each particle is determined based on a constraint condition, and the constraint condition is set based on a boundary value of the data in the training set;

step 42: calculating, based on the nitrogen oxide indicator model, the carbon monoxide indicator model, and the carbon dioxide indicator model, a fitness value of each particle for evaluating the particle;

step 43: establishing a self-adaptive grid algorithm-based external archive and storing a non-dominated particle in the external archive based on the fitness value of each particle;

step 44: updating a particle position and speed for each particle within the constraint condition, where a global optimal particle selection method in an updating process is based on the external archive established in step 43, and a global optimal particle is selected from the external archive by a self-adaptive grid algorithm to enhance diversity of the algorithm;

step 45: repeating steps 42-44 for each particle with an updated position and speed until a predetermined number of iterations is reached, and outputting the Pareto optimal solution set corresponding to each non-dominated particle in the external archive at a last iteration.

In an embodiment, a weight coefficient of the utility function in the step 5 is set according to an actual situation and a decision-making preference.

Compared with the prior art, the present disclosure has the following beneficial effects:

According to the intelligent operational optimization method in municipal solid waste incineration process provided by the present disclosure, in one aspect, an accurate and effective performance indicator model used in the municipal solid waste incineration process is established based on good nonlinear mapping capability of the SORBF neural network, which can accurately characterize dynamic characteristics of $NO_x$ emissions and combustion efficiency, and lay a good foundation for optimizing and solving subsequent operational variables. In another aspect, a fitness evaluation function is established by using the SORBF neural network, and iterative solving is performed based on the multi-objective particle swarm optimization algorithm to obtain optimized operational variables, thereby collaboratively improving the combustion efficiency and the denitration efficiency, which improves an intelligent level of the municipal solid waste incineration process, and promotes efficient and environmentally-friendly operation of the municipal solid waste incineration process.

BRIEF DESCRIPTION OF THE DRAWINGS

The present disclosure is further described below with reference to accompanying drawings.

DETAILED DESCRIPTION OF THE EMBODIMENTS

Technical solutions in embodiments of the present disclosure will be described in detail below with reference to accompanying drawings in the embodiments of the present disclosure. Apparently, the described embodiments are merely part of the embodiments of the present disclosure rather than all of the embodiments. Based on the embodiments of the present disclosure, all other embodiments obtained by those skilled in the art without creative work belong to the scope of protection of the present disclosure.

An objective of the present disclosure is to provide an intelligent operational optimization method in a municipal solid waste incineration process. With optimization objectives of improving combustion efficiency and reducing $NO_x$ emissions, optimal setting values of operational variables (including the grate speed, the primary air inlet flow, the primary air outlet pressure, and the secondary air inlet flow) during the municipal solid waste incineration process are sought in the case of satisfying an actual constraint condition, so as to provide guidance for an actual industrial process.

To make above objective, features, and advantages of the present disclosure more apparent and more comprehensible, the present disclosure is further described in detail below with reference to the accompanying drawings and specific implementations.

Figure 1:
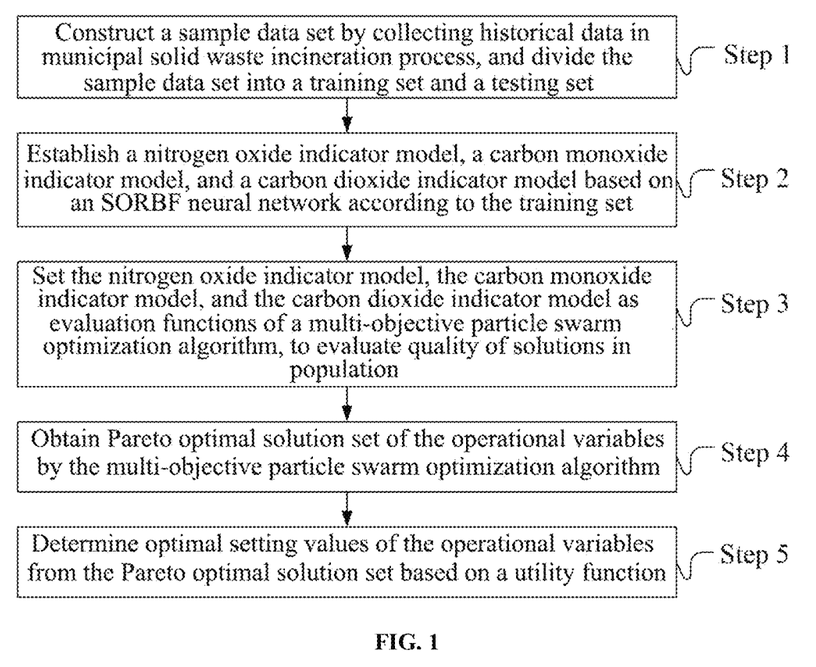
FIG. 1 is a first flowchart of an intelligent operational optimization method in a municipal solid waste incineration process according to the present disclosure.

The intelligent operational optimization method in municipal solid waste incineration process of the present disclosure is described below with reference to FIG. 1 to FIG. 8. As shown in FIG. 1, the method includes the following step 1 to step 5.

In step 1: a sample data set is constructed by collecting historical data in municipal solid waste incineration process, and the sample data set is divided into a training set and a testing set.

In step 2: a nitrogen oxide indicator model, a carbon monoxide indicator model, and a carbon dioxide indicator model are established based on an SORBF neural network according to the training set to characterize a mapping relationship between operational variables and optimization objectives in the solid waste incineration process, where the operational variables include a grate speed, a primary air inlet flow, a primary air outlet pressure, and a secondary air inlet flow, the optimization objectives include reducing nitrogen oxide emissions and improving combustion efficiency, and the combustion efficiency is calculated by output values of the carbon monoxide indicator model and the carbon dioxide indicator model.

In step 3: the nitrogen oxide indicator model, the carbon monoxide indicator model, and the carbon dioxide indicator model are set as evaluation functions of a multi-objective particle swarm optimization algorithm, for evaluating quality of solutions in population.

In step 4: Pareto optimal solution set of the operational variables is obtained by the multi-objective particle swarm optimization algorithm.

In step 5: optimal setting values of the operational variables are determined from the Pareto optimal solution set based on a utility function.

Specifically, the historical data of solid waste are collected and stored through a collecting device. During specific collection, the historical data may be collected every preset time interval, and the preset time interval may be 30 seconds, 25 seconds, 40 seconds, and the like, which is not specifically limited here. During each collection, related variable data such as the grate speed, the primary air inlet flow, the primary air outlet pressure, the secondary air inlet flow, a $NO_x$ concentration, a CO concentration, and a $CO_2$ concentration in the solid waste incineration process are collected.

After enough historical data is collected, for example, after 1000 groups of historical data are collected, the sample data set is constructed based on the 1000 groups of historical data, and the sample data set is divided into the training set and the testing set. For example, first 700 groups of historical data or last 700 groups of historical data is obtained from the 1000 groups of data sets as the training set, and the rest data is as the testing set.

After the training set is determined, the nitrogen oxide indicator model, the carbon monoxide indicator model, and the carbon dioxide indicator model are established based on the SORBF neural network to characterize the mapping relationship between the operational variables and the optimization objectives in the solid waste incineration process. The operational variables include the grate speed, the primary air inlet flow, the primary air outlet pressure, and the secondary air inlet flow. The optimization objectives include reducing nitrogen oxide concentrations and improving combustion efficiency.

Output variables of the nitrogen oxide indicator model, the carbon monoxide indicator model, and the carbon dioxide indicator model are respectively determined as an $NO_x$ concentration, a CO concentration, and a $CO_2$ concentration according to the optimization objectives and a calculation equation of the combustion efficiency.

The calculation equation of the combustion efficiency is as follows:

$$CE = \frac{CO_2}{(CO_2 + CO)} * 100\%. \quad (1)$$

Methods for constructing the nitrogen oxide indicator model, the carbon monoxide indicator model, and the carbon dioxide indicator model are the same, but inputs of various models are different, and outputs of various models are also different. An input variable of the nitrogen oxide indicator model is $x_{NOx}=(x_1^{nox}, x_2, x_3, x_4, x_5)^T$, where $x_1^{nox}$ denotes a nitrogen oxide ($NO_x$) concentration at a $(t-1)^{th}$ time in the historical data, $x_2$ denotes the grate speed at a $t^{th}$ time, $x_3$, $x_4$, $x_5$ denote the primary air inlet flow, the primary air outlet pressure, and the secondary air inlet flow, respectively, at the $t^{th}$ time, and T denotes a transposition symbol. An input variable of the carbon monoxide indicator model is $x_{co}=(x_1^{co}, x_2, x_3, x_4, x_5)^T$, where $x_1^{co}$ denotes a CO concentration at the $(t-1)^{th}$ time, $x_2$ denotes the grate speed at the $t^{th}$ time, and $x_3$, $x_4$, $x_5$ denote the primary air inlet flow, the primary air outlet pressure, and the secondary air inlet flow. Respectively, at the $t^{th}$ time. An input variable of the carbon dioxide indicator model is $x_{co_2}=(x_1^{co_2}, x_2, x_3, x_4, x_5)^T$, where $x_1^{co_2}$ denotes a $CO_2$ concentration at the $(t-1)^{th}$ time, $x_2$ denotes the grate speed at the $t^{th}$ time, and $x_3$, $x_4$, $x_5$ denote the primary air inlet flow, the primary air outlet pressure, and the secondary air inlet flow, respectively, at the $t^{th}$ time.

The nitrogen oxide indicator model, the carbon monoxide indicator model, and the carbon dioxide indicator model are set as the evaluation functions of the multi-objective particle swarm optimization algorithm, to evaluate the quality of the solutions in the population, and then the Pareto optimal solution set of the operational variables is obtained by solving, and finally determining the optimal setting values of the operational variables is determined from the Pareto optimal solution set by using a utility function set based on demands.

According to the intelligent operational optimization method in municipal solid waste incineration process provided by the present disclosure, in one aspect, an accurate and effective performance indicator model used in the municipal solid waste incineration process is established based on good nonlinear mapping capability of the SORBF neural network, which can accurately characterize dynamic characteristics of $NO_x$ emissions and combustion efficiency, and lay a good foundation for optimizing and solving subsequent operational variables. In another aspect, a fitness evaluation function is established by using the SORBF neural network, and iterative solving is performed based on the multi-objective particle swarm optimization algorithm to obtain optimized operational variables, thereby collaboratively improving combustion efficiency and denitration efficiency, which improves an intelligent level of the municipal solid waste incineration process, and promotes efficient and environmentally-friendly operation of the municipal solid waste incineration process.

In an embodiment, step 1 specifically includes: the historical data in the municipal solid waste incineration process is collected and stored through a detection device. The historical data includes the grate speed, the primary air inlet flow, the primary air outlet pressure, the secondary air inlet flow, the $NO_x$ concentration, the CO concentration, and the $CO_2$ concentration. The sample data set is constructed based on the collected historical data.

In an embodiment, a method for establishing the indicator models in step 2 includes the following step 21 to step 26.

In step 21: the SORBF neural network is trained according to the training set, where the SORBF neural network contains 0 hidden layer neuron at an initial moment.

In step 22: a first hidden layer neuron is added to the SORBF neural network based on a training sample corresponding to an expected output value with maximum absolute value in the training set.

In step 23: a parameter of the SORBF neural network added with the first hidden layer neuron is adjusted based on a second-order learning algorithm.

In step 24: an error vector of the training set is calculated based on the data in the training set and an output of the SORBF neural network. The error vector includes an error value of each training sample. An error peak point is determined, and the error peak point is the error value with a maximum absolute value. A next hidden layer neuron is added to the SORBF neural network based on the training sample corresponding to the error peak point.

In step 25: a parameter of the SORBF neural network added with the next hidden layer neuron is adjusted based on the second-order learning algorithm.

In step 26: the step of adding the next hidden layer neuron to the SORBF neural network based on the training sample corresponding to the error peak point and the step of adjusting the parameter of the SORBF neural network added with the next hidden layer neuron are repeated, until learning accuracy of the SORBF neural network reaches predetermined accuracy or until the number of hidden layer neurons in the SORBF neural network reaches a predetermined number, thereby completing construction of the nitrogen oxide indicator model, the carbon monoxide indicator model, or the carbon dioxide indicator model.

When the nitrogen oxide indicator model, the carbon monoxide indicator model, and the carbon dioxide indicator model are constructed, inputs of the SORBF neural network are different, and outputs of the SORBF neural network are also different. The inputs are determined from the training set.

Figure 2:
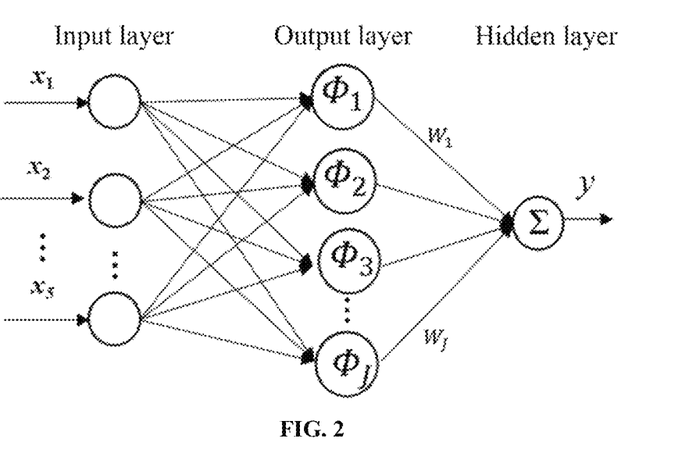
FIG. 2 is a schematic structural diagram of an SORBF neural network according to the present disclosure.

Specifically, the above method is a general method for constructing the nitrogen oxide indicator model, the carbon monoxide indicator model, and the dioxide indicator model. For constructing different indicator models, the inputs of the SORBF neural network model are different, and the outputs of the SORBF neural network model are also different. The inputs are determined from the training set. FIG. 2 shows a structure of the SORBF neural network model.

An equation for calculating an $NO_x/CO/CO_2$ concentration output by the nitrogen oxide indicator model/the carbon monoxide indicator model/the dioxide indicator model, respectively, is as follows:

$$y = \Sigma_{j=1}^{J} w_j \Phi_j(x); \qquad (2)$$

where, y is an output of the SORBF neural network model, x is an input variable (after being normalized) of the nitrogen oxide indicator model/the carbon monoxide indicator model/the dioxide indicator model, $w_j$ is an output weight from a $j^{th}$ hidden layer neuron to an output neuron, $\Phi_j$ is an output of the $j^{th}$ hidden layer neuron, and J is a total number of the hidden layer neurons.

A method for constructing the indicator models based on the SORBF neural network is as follows:

(1) When constructing the indicator model, the initial number of the hidden layer neurons of the SORBF neural network is 0.

(2) At the initial moment, the training sample corresponding to a maximum absolute residual of a current SORBF neural network is a training sample $k_1$ corresponding to the expected output value with the maximum absolute value:

$$k_1 = \text{argmax}[\|y_{h1}\|, \|y_{h2}\|, \ldots, \|y_{hp}\|, \ldots, \|y_{hP}\|]; \qquad (3)$$

where, P denotes a number of training samples in the training set, $y_{hp}$ denotes an expected output value of a $p^{th}$ training sample, and the expected output value is an actual $NO_x/CO/CO_2$ concentration in the historical data.

The first hidden layer neuron added to the SORBF neural network is set as follows:

$$c_1 = x_{k_1} \qquad (4)$$

$$w_1 = y_{hk_1} \qquad (5)$$

$$\sigma_1 = 1; \qquad (6)$$

where, $c_1$ is a center vector of the first hidden layer neuron, $w_1$ is an output weight of the first hidden layer neuron, $\sigma_1$ is a width of the first hidden layer neuron, $x_{k_1}$ is an input vector of the training sample $k_1$, and $y_{hk_1}$ is an expected output value of the training sample $k_1$.

(3) The parameter of the SORBF neural network added with the first hidden layer neuron is adjusted based on the second-order learning algorithm. An adjustment method is as follows:

$$\Psi(\eta + 1) = \Psi(\eta) - (H(\eta) + \lambda I(\eta))^{-1} \Omega(\eta)); \qquad (7)$$

where, $\eta$ is the number of iterations for adjusting the parameter (for example, the number of iterations may be set as 50), H is a quasi-Hessian matrix, $\lambda$ is a learning rate (for example, may be 0.01), I is an identity matrix, $\Omega$ is a gradient vector, and $\Psi$ is a parameter of the SORBF neural network that needs to be adjusted, $$\Psi(\eta) = [c_1(\eta), \sigma_1(\eta), w_1(\eta)]. \qquad (8)$$

To reduce computation complexity, the quasi-Hessian matrix H is converted into a sum of P quasi-Hessian sub matrixes h, and the gradient vector $\Omega$ is converted into a sum of P gradient sub-vectors g, which are specifically as follows:

$$H(\eta) = \Sigma_{p=1}^{P} h_p(\eta) \qquad (9)$$

$$\Omega(\eta) = \Sigma_{p=1}^{P} g_p(\eta). \qquad (10)$$

When the network parameter is adjusted for an $\eta^{th}$ time, calculation equations for $p^{th}$ Quasi Hessian sub-matrix $h_p(\eta)$ and gradient sub-vector $g_p(\eta)$ are as follows:

$$h_p(\eta) = j_p^T(\eta) j_p(\eta) \qquad (11)$$

$$g_p(\eta) = j_p^T(\eta) e_p(\eta); \qquad (12)$$

where, $e_p(\eta)$ is a difference value between a network output value $y_p(\eta)$, of the $p^{th}$ training sample, output by the SORBF neural network adjusted for the $\eta^{th}$ time and an expected output value $y_{hp}$, $j_p(\eta)$ is a Jacobian vector, and T is a transposition symbol.

A calculation method for $e_p(\eta)$ is as follows:

$$e_p(\eta) = y_p(\eta) - y_{hp}. \qquad (13)$$

A calculation method for the Jacobian vector is as follows:

$$j_p(\eta) = \left[\frac{\partial e_p(\eta)}{\partial c_{11}(\eta)}, \ldots, \frac{\partial e_p(\eta)}{\partial c_{15}(\eta)}, \frac{\partial e_p(\eta)}{\partial \sigma_1(\eta)}, \frac{\partial e_p(\eta)}{\partial w_1(\eta)}\right]; \quad (14)$$

where, $[c_{11}(\eta), c_{12}(\eta), c_{13}(\eta), c_{14}(\eta), c_{15}(\eta)]$ is a center vector at $\eta^{th}$ iteration, and $c_{11}(\eta), c_{12}(\eta), c_{13}(\eta), c_{14}(\eta)$ and $c_{15}(\eta)$ denote elements in the center vector at $\eta^{th}$ iteration, respectively, $w_1(\eta)$ and $\sigma_1(\eta)$ denote a weight and a width at $\eta^{th}$ iteration, respectively, and $y_p(\eta)$ is a network output at $\eta^{th}$ iteration.

(4) An error vector e of the training set is calculated, and the error vector including an error value of each training sample is as follow:

$$e = [e_1, e_2, \ldots, e_p, \ldots, e_P]. \quad (15)$$

The error value of the $p^{th}$ training sample is calculated as follows:

$$e_p = y_p - y_{hp}; \quad (16)$$

where, $y_p$ is a network output value of the $p^{th}$ training sample output by the SORBF neural network, and $y_{hp}$ is an expected output value of the $p^{th}$ training sample.

The training sample k corresponding to a current error peak point is sought based on the error vector e of the training set, and the error peak point is the error value with the maximum absolute value:

$$k = \mathrm{argmax}\|e\|. \quad (17)$$

A next (that is, an $l^{th}$) hidden layer neuron is newly added to the SORBF neural network based on the training sample corresponding to the error peak point. A center vector $c_l$ and an output weight $w_l$ of the hidden layer neuron are as follows:

$$c_l = x_k \quad (18)$$

$$w_l = y_{hk}; \quad (19)$$

where, x is an input vector of a $k^{th}$ training sample, and $y_{hk}$ is an expected output value of the $k^{th}$ training sample.

To avoid structural redundancy of the neural network model, it is expected that existing hidden layer neurons in the SORBF neural network have a relatively small impact on the newly added hidden layer neuron. Therefore, the width $\sigma_l$ of the newly added hidden layer neuron is set as follows:

$$c_{min} = \mathrm{argmin}(dist(c_l, c_{j \ne l})) \quad (20)$$

$$\sigma_l = a\|c_l - c_{min}\|; \quad (21)$$

where, $c_{min}$ is the center vector of the hidden layer neuron that is closest to an $l^{th}$ hidden layer neuron in the SORBF neural network, $c_j$ is a center vector of the next hidden layer neuron other than the $l^{th}$ hidden layer neuron in the SORBF neural network, a is an adjustment according to different indicator models. For example, values of a of the nitrogen oxide indicator model, the carbon monoxide indicator model, and the carbon dioxide indicator model may be: 0.8, 0.65, and 0.8, respectively.

(5) After the first hidden layer neuron is added, it is continued to add the next hidden layer neuron for the SORBF neural network. The next hidden layer neuron is newly added based on the training sample corresponding to the error peak point in all training samples of the training set.

After the next neuron is newly added, the parameter of the SORBF neural network newly added with the next hidden layer neuron is adjusted based on the second-order learning algorithm. A specific adjustment method is the same as the method for adjusting the parameter of the SORBF neural network after the first hidden layer neuron added.

The above step of adding a next hidden layer neuron to the SORBF neural network based on the training sample corresponding to the error peak point and the above step of adjusting the parameter of the SORBF neural network model newly added with the next hidden layer neuron are repeated, until learning accuracy of the SORBF neural network model reaches predetermined accuracy or until the number of hidden layer neurons in the radial basis function (RBF) neural network model reaches a predetermined number, thereby completing construction of the nitrogen oxide indicator model, the carbon monoxide indicator model, or the carbon dioxide indicator model. That is:

if the number of the hidden layer neurons in the SORBF neural network reaches $J_{max}$, or mean square error (MSE) of the learning accuracy is less than $E_0$, the construction of the nitrogen oxide indicator model, the carbon monoxide indicator model, or the carbon dioxide indicator model is completed. $J_{max}$ corresponding to the nitrogen oxide indicator model, the carbon monoxide indicator model, or the carbon dioxide indicator model may be 13, 10, and 10, respectively.

The learning accuracy of a network may be measured by using the MSE, which is specifically calculated as follows:

$$MSE = \frac{1}{P}\sum_{p=1}^{P}(y_p - y_{hp})^2; \quad (22)$$

where, $y_{hp}$ is an expected output value of the $p^{th}$ training sample, $y_p$ is a network output value of the $p^{th}$ training sample output by the SORBF neural network model, and P is the total number of the training samples.

The nitrogen oxide indicator model, the carbon monoxide indicator model, or the carbon dioxide indicator model are constructed by the SORBF neural network with the learning accuracy reaching predetermined accuracy or the number of hidden layer neurons reaching a predetermined number.

Exemplarily, after the nitrogen oxide indicator model, the carbon monoxide indicator model, or the carbon dioxide indicator model are constructed, the above indicator models may be validated to determine whether the above indicator models meet requirements, which are specifically validated by using the testing set partitioned from the sample data set. For example, the training set and the testing set may be obtained by partitioning the sample data set according to a predetermined ratio, for example, the predetermined ratio may be 7/3 or 8/2, and a ratio of data in the training set to data in the sample data set is higher than that of data in the testing set to data in the sample data set.

Testing samples in the testing set serve as the inputs of the nitrogen oxide indicator model, the carbon monoxide indicator model, or the carbon dioxide indicator model. The outputs of the nitrogen oxide indicator model, the carbon monoxide indicator model, or the carbon dioxide indicator model are fitting values of an $NO_x$ concentration, a CO concentration, and a $CO_2$ concentration, respectively. Fitting accuracy of each of the nitrogen oxide indicator model, the carbon monoxide indicator model, and the carbon dioxide indicator model is quantitatively evaluated by using root-mean square (RMSE) and mean absolute percentage error (MAPE) respectively. The RMSE and the MAPE are calculated as follows:

$$RMSE = \sqrt{\frac{1}{M}\sum_{m=1}^{M}(y_m - y_{hm})} \tag{23}$$

$$MAPE = \frac{100\%}{M}\sum_{m=1}^{M}\left|\frac{y_m - y_{hm}}{y_{hm}}\right|; \tag{24}$$

where, M is a total number of the testing samples of the testing set, $y_m$ is a network output value of the nitrogen oxide indicator model/the carbon monoxide indicator model/the carbon dioxide indicator model for an $m^{th}$ test sample, and $y_{hm}$ is an expected output value of the $m^{th}$ sample. Lower RMSE and the MAPE indicate higher fitting accuracy.

Figure 3:
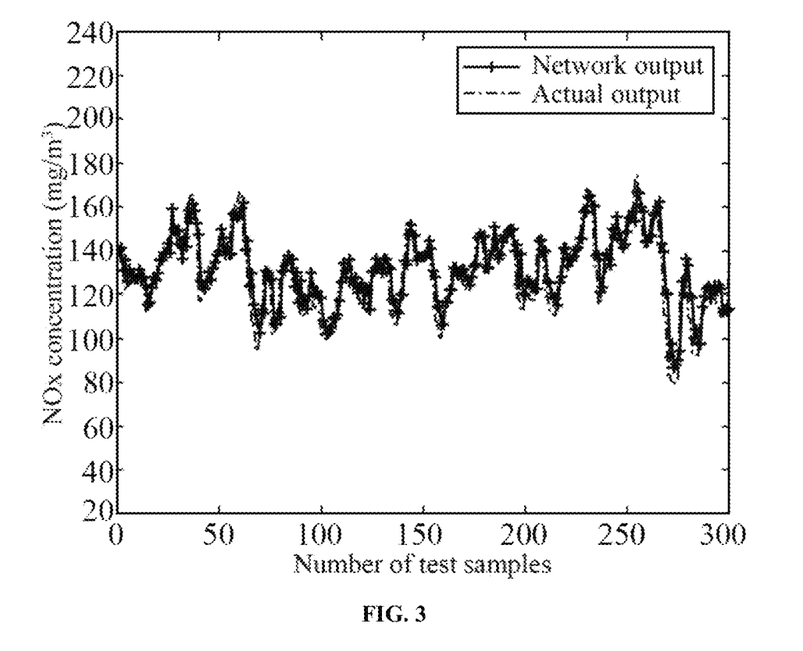
FIG. 3 is a schematic diagram of a test result of a nitrogen oxide indicator model according to the present disclosure.
Figure 4:
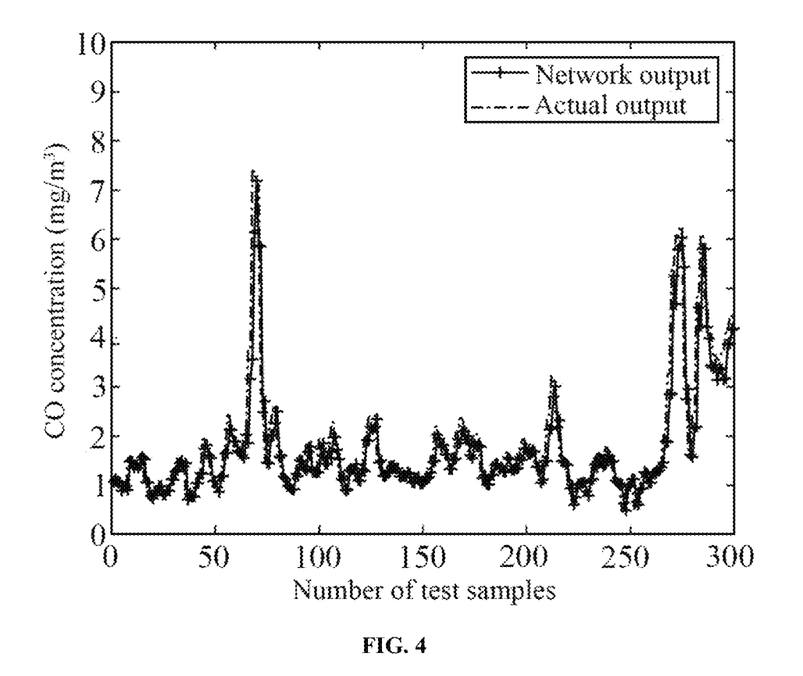
FIG. 4 is a schematic diagram of a test result of a carbon monoxide indicator model according to the present disclosure.
Figure 5:
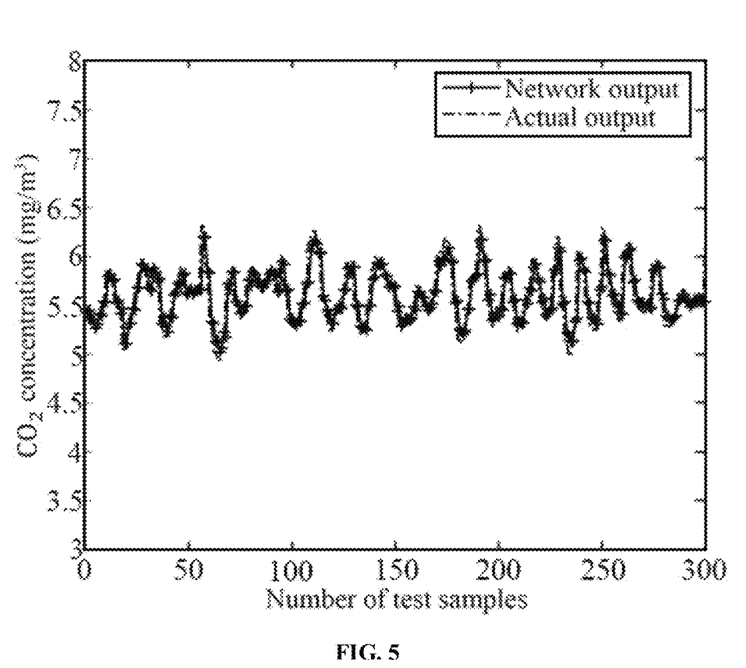
FIG. 5 is a schematic diagram of a test result of a carbon dioxide indicator model according to the present disclosure.

FIG. 3, FIG. 4, and FIG. 5 show test results of the nitrogen oxide indicator model, the carbon monoxide indicator model, and the carbon dioxide indicator model, respectively. In FIG. 3, FIG. 4, and FIG. 5, x axis represents the number of the test samples, measured in piece; y axes in FIG. 3, FIG. 4, and FIG. 5 represents concentrations of $NO_x$, CO, and $CO_2$, respectively, measured in mg/m³; and network outputs in FIG. 3, FIG. 4, and FIG. 5 are fitting values of the nitrogen oxide indicator model, the carbon monoxide indicator model, and the carbon dioxide indicator model, respectively. The fitting accuracy of each indicator model is quantitatively evaluated by using the RMSE and the MAPE. For the nitrogen oxide indicator model, the RMSE obtained by using the testing set is 9.3939, and the MAPE is 5.5603%. For the carbon monoxide indicator model, the RMSE obtained by using the testing set is 0.5368, and the MAPE is 15.4444%. For the carbon dioxide indicator model, the RMSE obtained by using the testing set is 0.1866, and the MAPE is 2.2523%.

In an embodiment, step 4 specifically includes the following step 41 to step 45.

In step 41: an initial position and an initial speed of each particle in a particle swarm are initialized; where the initial speed of each particle is 0, the initial position of each particle is determined based on a constraint condition, and the constraint condition is set based on a boundary value of the data in the training set.

In step 42: a fitness value of each particle is calculated, based on the nitrogen oxide indicator model, the carbon monoxide indicator model, and the carbon dioxide indicator model, for evaluating the particle.

In step 43: a self-adaptive gird algorithm based external archive is established, and a non-dominated particle is stored in the external archive based on the fitness values of each particle.

In step 44: a particle position and speed are updated for each particle within the constraint condition, where a global optimal particle selection method in an updating process is based on the external archive established in step 43, and a global optimal particle is selected from the external archive by a self-adaptive grid algorithm to enhance diversity of the algorithm.

In step 45: above steps of evaluating the fitness value, updating the external archive, and updating the particle position and speed, i.e., step 42, step 43 and step 44, are repeated for each particle with an updated position and speed until a predetermined number of iterations is reached, and the Pareto optimal solution set corresponding to each non-dominated particle in the external archive at a last iteration is output.

Figure 6:
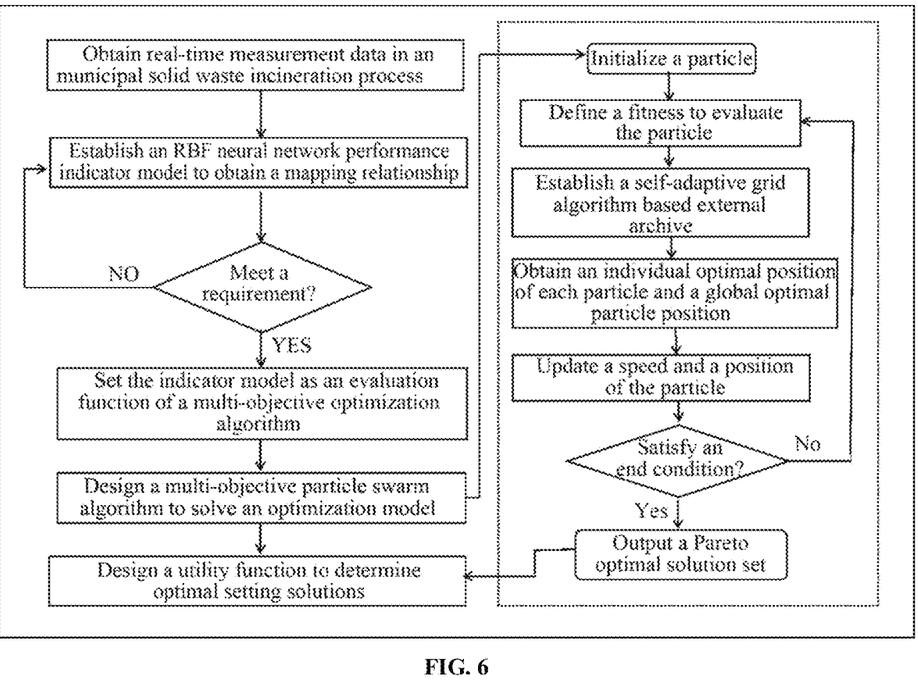
FIG. 6 is a second flowchart of an intelligent operational optimization method in a municipal solid waste incineration process according to the present disclosure.

Specifically, as shown in FIG. 6, a method for obtaining the Pareto optimal solution set of the operational variables by the multi-objective particle swarm optimization algorithm includes steps (1)-(6).

Step (1) An initial position and an initial speed of each particle in a particle swarm are initialized; where the initial speed of each particle is 0, and the initial position of each particle is determined based on a constraint condition.

As there are four operational variables, the number of dimensions of the operational variables is 4. The maximum of the operational variable in the training data is set as an upper boundary, and the minimum of the operational variables is set as a lower boundary. The constraint condition is that the position of the particle needs to be between the upper boundary and the lower boundary of the operational variable. Exemplarily, an initial position $z_{i,d}$ and an initial speed $v_{i,d}$ of the particle are, respectively, as follows:

$$z_{i,d} = LB_d + r*(UB_d - LB_d) \tag{25}$$

$$v_{i,d} = \vec{0}; \tag{26}$$

where, $LB_d$ represents a lower boundary of a $d^{th}$ dimensional operational variable, $UB_d$ represents an upper boundary of the $d^{th}$ dimensional operational variable, r is a random number between 0 and 1, i=1, 2, . . . , Q (Q is the number of the particles in the particle swarm, and may be 200), d=1, 2, 3, 4, $z_{i,d}$ denotes a position of an $i^{th}$ particle under the $d^{th}$ dimensional operational variable, and $v_{i,d}$ denotes a speed of the $i^{th}$ particle under the $d^{th}$ dimensional operational variable.

Step (2) After initialization, a fitness value of each particle is calculated, based on the nitrogen oxide indicator model, the carbon monoxide indicator model, and the carbon dioxide indicator model. A calculation method is as follows:

Each particle in the particle swarm is input into the above nitrogen oxide indicator model, the carbon monoxide indicator model, and the carbon dioxide indicator model as a variable to calculate the $NO_x$ concentration, the CO concentration, and the $CO_2$ concentration, respectively. Fitness functions $f_1(z)$ and $f_2(z)$ (i.e., target functions) are defined to calculate the fitness values of each particle, where z denotes a position vector of each particle. The fitness function is as follows:

$$\begin{cases} f_1(z) = g_{nox} \\ f_2(z) = -\dfrac{g_{co2}}{g_{co} + g_{co2}} \end{cases}; \tag{27}$$

where, $g_{nox}$ is obtained by reverse normalization calculation on the $NO_x$ concentration output by the nitrogen oxide indicator model, co is obtained by reverse normalization calculation on the CO concentration output by the carbon monoxide indicator model, and $g_{co2}$ is obtained by reverse normalization calculation on the $CO_2$ concentration output by the carbon dioxide indicator model. The value of each particle calculated based on the above fitness function is the fitness value of each particle, and a non-dominated particle in the particle swarm may be determined based on the fitness value.

Step (3) A self-adaptive gird algorithm based external archive is established, and a current non-dominated particle is stored.

For the external archive, a gird is generated in target function space of each current particle by using the self-adaptive grid algorithm, and each particle is defined by using the grid as an index, and a grid index of each particle may be determined according to a value of the fitness functions. The gird of the external archive is expressed as follows:

$$\text{grid.} LB_\mu = \min f_\mu - \beta (\max f_\mu - \min f_\mu) \\ \text{grid.} UB_\mu = \min f_\mu + \beta (\max f_\mu - \min f_\mu); \tag{28}$$

where, grid.$LB_\mu$ is a lower boundary of the grid, grid.$UB_\mu$ is an upper boundary of the grid, β is a coefficient (β may be 0.1), μ=1, 2 . . . K, and K denotes the number of the fitness functions, which is 2 in this embodiment.

The grid is uniformly divided into multiple sub-grids in each objective function dimension according to grid.$LB_\mu$ and grid.$UB_\mu$. Each particle is defined by using coordinates ($P_1, P_2, \ldots, P_K$) of each sub-grid in different objective function dimensions, where $P_1$ denotes a sorting position of the particle in a first objective function dimension, and $P_2$ denotes a sorting position of the particle in a second objective function dimension.

Step (4) An individual optimal position of each particle and a global optimal particle position of each particle in a current iteration are determined.

For selection of the global optimal particle, based on the external archive, density comparison is performed on sub-grids containing more than one particle to reduce the probability of selecting the sub-grid containing more non-dominated particles, the sub-grid for selecting the global optimal particle is obtained by roulette wheel method. Once the sub-grid is selected, the non-dominated particle is randomly selected as the global optimal particle from the sub-grid.

Step (5) The speed and position of the particle are updated. For example, if the current iteration is $it^{th}$ iteration, the updated speed and position of each particle for the $it^{th}+1$ iteration are, respectively, as follows:

$$v_{i,d}(\text{it}+1) = \omega v_{i,d}(\text{it}) + \tilde{c}_1 r_1 (p_{i,d}(\text{it}) - z_{i,d}(\text{it})) + \tag{29}$$

$$\tilde{c}_2 r_2 (g_{i,d}(\text{it}) - z_{i,d}(\text{it})) z_{i,d}(\text{it}+1) = z_{i,d}(\text{it}) + v_{i,d}(\text{it}+1);$$

where, $v_{i,d}(\text{it})$ is the speed of the $i^{th}$ particle under the $d^{th}$ dimensional operational variable at $it^{th}$ iteration, $v_{i,d}(\text{it}+1)$ is the speed of the $i^{th}$ particle under the $d^{th}$ dimensional operational variable at $(\text{it}+1)^{th}$ iteration, $z_{i,d}(\text{it})$ is the position of the $i^{th}$ particle under the $d^{th}$ dimensional operational variable at $it^{th}$ iteration, $z_{i,d}(\text{it}+1)$ is the position of the $i^{th}$ particle under the $d^{th}$ dimensional operational variable at $(\text{it}+1)^{th}$ iteration, $p_{i,d}(\text{it})$ denotes an individual optimal position of the $i^{th}$ particle at $it^{th}$ iteration (the individual optimal position is an optimal position of the $i^{th}$ particle searched until the $it^{th}$ iteration), $g_{i,d}(\text{it})$ denotes the position of the global optimal particle at $it^{th}$ iteration, $r_1$ and $r_2$ are random numbers between 0 and 1, ω, $\tilde{c}_1$, and $\tilde{c}_2$ are flight parameters of the particle swarm algorithm, ω is an inertial weight, ω decays linearly with the number of iterations with a decay rate of 0.99, $\tilde{c}_1$ and $\tilde{c}_2$ are learning factors, and the learning factors may be 1 and 2, respectively.

To ensure that the updated particle meets an actual constraint condition, the updated particle position needs to be checked. The updated particle position $z_{i,d}$ (it+1) is compared with a boundary limitation of the constraint condition. If the updated particle position is greater than the upper boundary, the position in this dimension is set as the upper boundary $UB_d$; and if the updated particle position is smaller than the lower boundary, the position is set as the lower boundary $LB_d$, as shown in the following equation:

$$z_{i,d}(\text{it}+1) = \begin{cases} LB_d, & z_{i,d}(\text{it}+1) < LB_d \\ z_{i,d}(\text{it}+1), & LB_d < z_{i,d}(\text{it}+1) < UB_d \\ UB_d, & z_{i,d}(\text{it}+1) > UB_d \end{cases} \tag{30}$$

Step (6) Above steps from calculating the fitness value to updating the position and speed, i.e., steps (2)-(5), are repeated for each particle with the updated position and speed until a predetermined number of iterations is reached, and the Pareto solution set corresponding to each non-dominated particle in the external archive is output at the last iteration. For example, the preset number of iterations may be 100 times, 120 times, 150 times, and the like, which is not specifically limited here. After the Pareto solution set is obtained, the utility function is set, and optimal operational variables are determined from the Pareto solution set based on the utility function.

In an embodiment, a weight coefficient of the utility function in step 5 is set according to an actual situation and a decision-making preference.

Exemplarily, a specific method for setting the utility function to determine the optimal setting solutions of the operational variables including the grate speed, the primary air inlet flow, the primary air outlet pressure, and the secondary air inlet flow is as follows:

To determine the optimal setting values of the operational variables from the Pareto optimal solution set solved by the multi-objective particle swarm optimization algorithm, a method for determining an optimal setting value based on the Pareto optimal solution set is designed. For example, each optimization objective preference may be determined according to a current actual situation and preference information of a decision maker, and the utility function of a solution in the Pareto optimal solution set is defined to determine an optimal solution, where the utility function $U_r$ of an $r^{th}$ solution in the Pareto optimal solution set is expressed as:

$$U_r = \sum_{\mu=1}^{K} \delta_\mu f_{r,\mu}, ; r = 1, 2, \ldots, R \tag{31}$$

$$\sum_{\mu=1}^{K} \delta_\mu = 1;$$

where, R denotes the number of the solutions in the Pareto solution set, and $\delta_\mu$ is a weight coefficient of a $u^{th}$ optimization objective, which may be specifically determined according to the decision-making preference and the actual situation of an incineration plant. There are two optimization objectives in this embodiment. To achieve balanced optimization of the two optimization objectives, for example, a ratio of a first optimization objective weight to a second optimization objective weight may be set as 0.3:0.7. During an actual incineration process, the operational variables need to be optimized every regular time intervals (for example, every other 4 minutes). In the Pareto solution set obtained by each optimization, a solution with a minimum utility function value is determined as an optimal setting solution of the operational variable.

Figure 7:
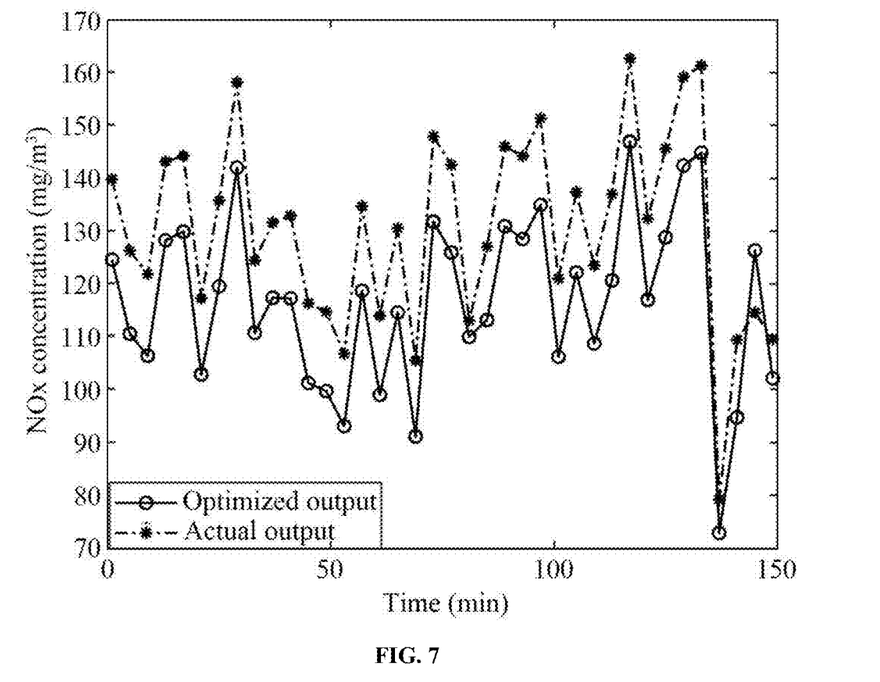
FIG. 7 is a schematic diagram of an optimization result of an $NO_x$ concentration according to the present disclosure.
Figure 8:
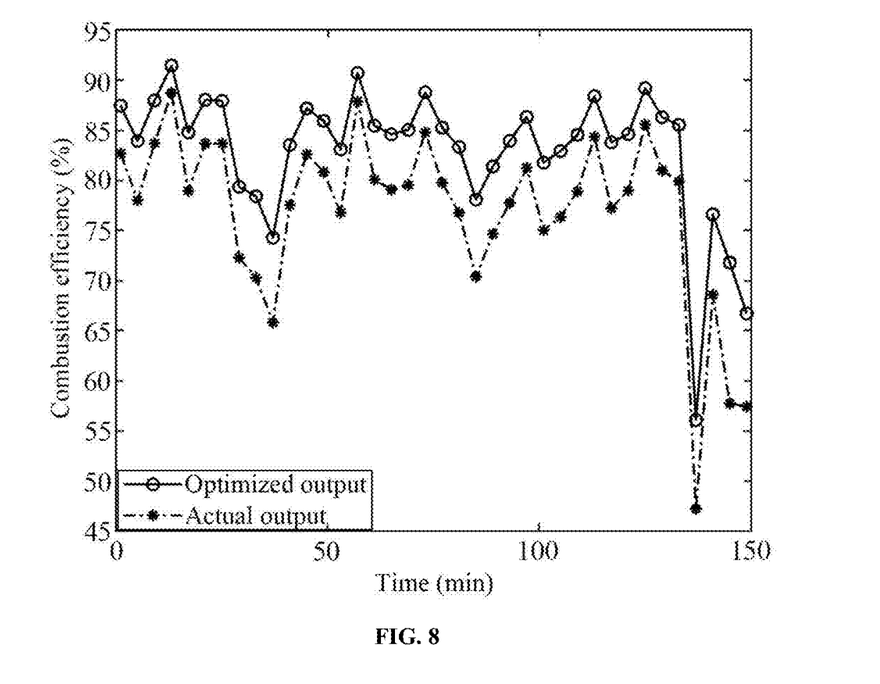
FIG. 8 is a schematic diagram of an optimization result of combustion efficiency according to the present disclosure.

FIG. 7 and FIG. 8 show diagrams of optimization results of the $NO_x$ concentration and the combustion efficiency, respectively, after optimization based on the above method. In FIG. 7 and FIG. 8, x axes represent an optimization duration, measured in min; y axes represent the $NO_x$ concentration and the combustion efficiency, respectively, measured in $mg/m^3$ and %, respectively; dotted lines and * represent actual values before optimization, respectively; and solid lines and o represent output values of the $NO_x$ concentration and the combustion efficiency, respectively, after optimization. It can be seen from FIG. 7 that the $NO_x$ concentration after optimization is significantly reduced compared with the actual $NO_x$ concentration before optimization, and the average $NO_x$ concentration after optimization can be reduced by 10.56%. It can be seen from FIG. 8 that the combustion efficiency after optimization is significantly improved compared with the actual combustion efficiency before optimization, and the average combustion efficiency can be improved by 8.24%.

In the above embodiment, the final optimal setting values of the operational variables can be obtained according to the actual situation and the decision-making preference by utility function, so as to collaboratively improve the combustion efficiency and the denitration efficiency.

The implementation manner of the present disclosure is described in detail in combination with the accompanying drawings above, but the present disclosure is not limited to the above implementation manner. Within the scope of knowledge possessed by those of ordinary skill in the art, various changes can be made without departing from the purpose of the present disclosure.

What is claimed is:

1. An intelligent operational optimization method in a municipal solid waste incineration process, comprising:
    step 1: constructing a sample data set by collecting historical data in a municipal solid waste incineration process, and dividing the sample data set into a training set and a testing set;
    step 2: establishing a nitrogen oxide indicator model, a carbon monoxide indicator model, and a carbon dioxide indicator model based on a self-organizing radial basis function (SORBF) neural network according to the training set to characterize a mapping relationship between operational variables and optimization objectives in the solid waste incineration process, wherein the operational variables comprise a grate speed, a primary air inlet flow, a primary air outlet pressure, and a secondary air inlet flow, the optimization objectives comprise reducing nitrogen oxide emissions and improving combustion efficiency, and the combustion efficiency is calculated by output values of the carbon monoxide indicator model and the carbon dioxide indicator model, wherein inputs of the nitrogen oxide indicator model at a current time comprise value of a nitrogen oxide concentration actually collected at a previous time and values of the operational variables at the current time, inputs of the carbon monoxide indicator model comprise value of a carbon monoxide concentration actually collected at the previous time and values of the operational variables at the current time, and inputs of the carbon dioxide indicator model comprise value of a carbon dioxide concentration actually collected at the previous time and values of the operational variables at the current time;
    step 3: setting the nitrogen oxide indicator model, the carbon monoxide indicator model, and the carbon dioxide indicator model as evaluation functions of a multi-objective particle swarm optimization algorithm, to evaluate quality of solutions in population;
    step 4: obtaining Pareto optimal solution set of the operational variables at the current time by the multi-objective particle swarm optimization algorithm; and
    step 5: determining optimal setting values of the operational variables from the Pareto optimal solution set at the current time based on a utility function;
    step 6: adjusting values of a grate speed, a primary air inlet flow, a primary air outlet pressure, and a secondary air inlet flow for a target incinerator at the current time according to the optimal setting values determined at the current time, for performing a controlled municipal solid waste incineration of the target incinerator at the current time based on the adjusted values.

2. The method according to claim 1, wherein the step 1 comprises: collecting and storing the historical data in the municipal solid waste incineration process through a detection device, the historical data comprising the grate speed, the primary air inlet flow, the primary air outlet pressure, the secondary air inlet flow, an $NO_x$ concentration, a CO concentration, and a $CO_2$ concentration; and constructing the sample data set based on the collected historical data.

3. The method according to claim 1, wherein the establishing a nitrogen oxide indicator model, a carbon monoxide indicator model and a carbon dioxide indicator model in the step 2 comprises:
    step 21: training the SORBF neural network according to the training set, wherein the SORBF neural network contains 0 hidden layer neuron at an initial moment;
    step 22: adding a first hidden layer neuron to the SORBF neural network based on a training sample corresponding to an expected output value with maximum absolute value in the training set;
    step 23: adjusting a parameter of the SORBF neural network added with the first hidden layer neuron based on a second-order learning algorithm;
    step 24: calculating an error vector of the training set based on the data in the training set and an output of the SORBF neural network, wherein the error vector comprises an error value of each training sample; determining an error peak point, which is an error value with a maximum absolute value; and adding a next hidden layer neuron to the SORBF neural network based on the training sample corresponding to the error peak point;
    step 25: adjusting a parameter of the SORBF neural network added with the next hidden layer neuron based on the second-order learning algorithm; and
    step 26: repeating the step of adding the next hidden layer neuron based on the error peak point and the step of adjusting the parameter of the SORBF neural network added with the next hidden layer neuron, until learning accuracy of the SORBF neural network reaches predetermined accuracy or until a number of hidden layer neurons in the SORBF neural network reaches a predetermined number, thereby completing construction of the nitrogen oxide indicator model, the carbon monoxide indicator model, or the carbon dioxide indicator model; wherein inputs of the SORBF neural network are different and outputs of the SORBF neural network are also different when the nitrogen oxide indicator model, the carbon monoxide indicator model, and the carbon dioxide indicator model are constructed, and the inputs are determined from the training set.

4. The method according to claim 1, wherein the step 4 comprises:

step 41: initializing an initial position and an initial speed of each particle in a particle swarm, wherein the initial speed of each particle is 0, the initial position of each particle is determined based on a constraint condition, and the constraint condition is set based on a boundary value of the data in the training set;

step 42: calculating, based on the nitrogen oxide indicator model, the carbon monoxide indicator model, and the carbon dioxide indicator model, a fitness value of each particle for evaluating the particle;

step 43: establishing a self-adaptive grid algorithm-based external archive, and storing a non-dominated particle in the external archive based on the fitness value of each particle;

step 44: updating a particle position and speed for each particle within the constraint condition, wherein a global optimal particle selection method in an updating process is based on the external archive established in the step 3, and a global optimal particle is selected from the external archive by a self-adaptive grid algorithm to enhance diversity of the algorithm; and step 45: repeating above steps of evaluating the fitness value, updating the external archive library, and updating the particle position and speed for each particle with an updated position and speed until a predetermined number of iterations is reached, and outputting the Pareto optimal solution set corresponding to each non-dominated particle in the external archive at a last iteration.

5. The method according to claim 1, wherein a weight coefficient of the utility function in the step 5 is set according to an actual situation and a decision-making preference.

6. An intelligent operational optimization method in a municipal solid waste incineration process, comprising:

step 1: constructing a sample data set by collecting historical data in a municipal solid waste incineration process, and dividing the sample data set into a training set and a testing set;

step 2: establishing a nitrogen oxide indicator model, a carbon monoxide indicator model, and a carbon dioxide indicator model based on a self-organizing radial basis function (SORBF) neural network according to the training set to characterize a mapping relationship between operational variables and optimization objectives in the solid waste incineration process, wherein the operational variables comprise a grate speed, a primary air inlet flow, a primary air outlet pressure, and a secondary air inlet flow, the optimization objectives comprise reducing nitrogen oxide emissions and improving combustion efficiency, and the combustion efficiency is calculated by output values of the carbon monoxide indicator model and the carbon dioxide indicator model, wherein inputs of the nitrogen oxide indicator model at a current time comprise value of a nitrogen oxide concentration actually collected at a previous time and values of the operational variables at the current time, inputs of the carbon monoxide indicator model comprise value of a carbon monoxide concentration actually collected at the previous time and values of the operational variables at the current time, and inputs of the carbon dioxide indicator model comprise value of a carbon dioxide concentration actually collected at the previous time and values of the operational variables at the current time;

step 3: setting the nitrogen oxide indicator model, the carbon monoxide indicator model, and the carbon dioxide indicator model as evaluation functions of a multi-objective particle swarm optimization algorithm, to evaluate quality of solutions in population;

step 4: obtaining Pareto optimal solution set of the operational variables at the current time by the multi-objective particle swarm optimization algorithm; and step 5: determining optimal setting values of the operational variables from the Pareto optimal solution set at the current time based on a utility function;

step 6: adjusting values of a grate speed, a primary air inlet flow, a primary air outlet pressure, and a secondary air inlet flow for a target incinerator at the current time according to the optimal setting values determined at the current time;

step 7: controlling the target incinerator to perform a controlled municipal solid waste incineration at the current time based on the adjusted values.

* * * * *